United States Patent [19]
Clementi et al.

[11] Patent Number: 5,856,221
[45] Date of Patent: Jan. 5, 1999

[54] PROCESS FOR FORMING AN INTEGRATED CIRCUIT COMPRISING NON-VOLATILE MEMORY CELLS AND SIDE TRANSISTORS OF AT LEAST TWO DIFFERENT TYPES, AND CORRESPONDING IC

[76] Inventors: Cesare Clementi, Via Castelmorrone 4, Busto Arsizio (VA); Gabriella Ghidini, Via Galla Placidia 10, Milan; Carlo Riva, Via L. Manara 8, Renate Brianza (MI), all of Italy

[21] Appl. No.: 670,179

[22] Filed: Jun. 20, 1996

[30] Foreign Application Priority Data

Jun. 30, 1995 [EP] European Pat. Off. ............ 95830282

[51] Int. Cl.$^6$ .................................. H01L 21/8247
[52] U.S. Cl. ............................. 438/258; 438/261
[58] Field of Search ................. 437/34, 43, 57, 437/52; 438/257, 258, 261

[56] References Cited

U.S. PATENT DOCUMENTS

| | | | |
|---|---|---|---|
| 4,471,373 | 9/1984 | Shimizu et al. | 357/41 |
| 4,766,088 | 8/1988 | Kono et al. | 437/52 |
| 4,780,424 | 10/1988 | Holler et al. | 437/29 |
| 5,104,819 | 4/1992 | Freiberger et al. | |
| 5,188,976 | 2/1993 | Kume et al. | 437/43 |
| 5,292,681 | 3/1994 | Lee et al. | 437/48 |
| 5,340,764 | 8/1994 | Larsen et al. | 437/52 |
| 5,432,114 | 7/1995 | O | 437/56 |
| 5,514,889 | 5/1996 | Cho et al. | 257/316 |
| 5,576,226 | 11/1996 | Hwang | 437/24 |
| 5,591,681 | 1/1997 | Wristers et al. | 437/240 |

OTHER PUBLICATIONS

IEEE IEDM Technical Digest 93, 1993 pp. 321–324, Hsing-Huang Tsend et al., "Thin CVD Stacked Gate Dielectric For ULSI Technology", month unknown.

*Primary Examiner*—Richard Booth

[57] ABSTRACT

A process or forming an integrated circuit calls for the provision of at least one matrix of non-volatile memory cells including an intermediate dielectric multilayer comprising a lower silicon oxide layer, an intermediate silicon nitride layer and an upper silicon oxide layer. The process calls for the simultaneous provision in zones peripheral to the memory cells of at least one first and one second transistor type each having a gate dielectric of a first and a second thickness respectively. After formation of the floating gate of the cells with a gate oxide layer and a polycrystalline silicon layer and the formation of the lower silicon oxide layer and of the intermediate silicon nitride layer, the process in accordance with the present invention includes removal of said layers from the zones peripheral to the matrix, and formation of a first silicon oxide layer over the substrate in the areas of both types of transistor. The process further includes removal of the preceding layer from areas assigned only to the transistors of the second type; deposition of said upper silicon oxide layer over the memory cells, over the first silicon oxide layer in the areas of the transistors of the first type and over the substrate in the areas of the transistors of the second type; and formation of a second silicon oxide layer in the areas of both types of peripheral transistors.

17 Claims, 1 Drawing Sheet

PROCESS FOR FORMING AN INTEGRATED CIRCUIT COMPRISING NON-VOLATILE MEMORY CELLS AND SIDE TRANSISTORS OF AT LEAST TWO DIFFERENT TYPES, AND CORRESPONDING IC

BACKGROUND OF THE INVENTION

1. Field of the Invention

The present invention relates to a process for forming an integrated circuit comprising non-volatile memory cells and peripheral transistors of at least two different types.

Specifically, the present invention relates to a process providing for the implementation in a monocrystalline silicon substrate of at least one matrix of memory cells. In each memory cell a floating gate and a control gate, both electroconductive, are mutually electrically insulated by means of an intermediate dielectric multilayer. There is also provided simultaneous formation, in zones peripheral to the matrix, of at least first and second MOS transistor types.

The present invention also relates to an integrated circuit of the above mentioned type comprising non-volatile memory cells having an intermediate dielectric multilayer and at least two types of peripheral transistors.

2. Discussion of the Related Art

As is known in the field of electronic semiconductor technology, in order to reduce the area of integrated circuits there is a tendency towards ever greater integration scales with a reduction of component sizes. This has led to improvement of the quality of the materials used and to optimization of the processes for their formation.

The present invention relates to the field of the development of the techniques of formation of dielectric materials in a single integrated circuit, and in the formation of layers of different thickness and composition which perform different functions. On one hand the dielectric materials act as insulators providing electrical insulation of conductive layers and creating a barrier against contaminating substances coming from the outside environment, while on the other hand the dielectric materials act as active dielectrics allowing the passage of charges between layers of conductive materials.

In order to improve the quality and functionality of the above mentioned dielectrics it has been proposed in relatively recent times to provide multiple superimposed layers, in particular using layers of silicon oxides and/or silicon nitrides.

In the specific field of application of the present invention there are provided integrated memory circuits including, in addition to a plurality of memory cells arranged in one or more matrixes, external or peripheral circuits in which components are structurally similar to the cells and are provided by the same technology. Specific reference is made to MOS transistors.

Non-volatile memories, to which specific reference is made in the present invention, comprise different classes of devices or products which differ from each other by the structure of the individual memory cell and the type of application. Specifically reference is made to read-only memories which can be electrically programmed and erased (Erasable Programmable Read Only Memories) and specifically EPROM, EEPROM or FLASH. These types of memories can be distinguished from one another as some of them are both erasable and electrically programmable, while others require, e.g., ultraviolet light to be erased. For data storage, memory cells comprise in all cases a floating-gate MOS transistor integrated on a substrate usually of monocrystalline silicon. The amount of charge contained in the floating gate determines the logical state of the cell. Non-volatile memory cells are programmed in a discrete number of logical states allowing memorization of one or more bits per cell. In standard cells, for example, programming is provided in two logical states, written and erased, with memorization of one bit per cell.

The floating gate of electroconductive material, normally polysilicon, i.e. polycrystalline silicon or "poly", is completely surrounded by insulating material. In particular, over the floating gate a dielectric layer, so-called intermediate dielectric or interpoly, insulates the floating gate from an overlying control gate also of electroconductive material. The control gate can consist alternatively of a single polysilicon layer or of a double polysilicon-silicide layer and is coupled electrically to a programming terminal.

As known to those skilled in the art, the interpoly dielectric is particularly critical in terms of charge retention. Development of the technology has revealed as particularly advantageous the use of a multilayer intermediate dielectric. This preserves the insulating characteristics of the intermediate layer while avoiding the problem of loss of charge from the floating gate to the control gate, whether over the long term or when a high programming potential is applied to the control gate. In particular, as known to those skilled in the art, this class of intermediate dielectrics comprises a triple layer of silicon oxide, silicon nitride and silicon oxide, the so-called ONO. As described e.g. in U.S. Pat. No. 5,104,819, after formation of an underlying silicon oxide layer and deposition of silicon nitride, an upper silicon oxide layer is formed by deposition instead of by the conventional oxidation of the underlying nitride. This type of dielectric achieved has good charge retention capability and increased capacitive coupling between floating gate and control gate.

Regarding the so-called external or peripheral transistors, they are incorporated in circuits outside the memory cell matrix, e.g., logical, or matrix control circuits. Specifically in the framework of the present invention, reference is made, as indicated above, to MOS transistors.

MOS transistors include an active dielectric, the so-called gate dielectric, placed between the substrate and a gate of electroconductive material, normally polysilicon. The thickness of this dielectric determines the type of transistor formed, in terms of electrical properties. In the same circuit is sometimes integrated two types of transistors of the external circuitry having gate dielectrics of different thicknesses. Usually the active dielectric consists of a silicon oxide layer formed at a high temperature by oxidation of the substrate.

To minimize the number of production process steps of the entire integrated circuit it is known to make the memory cells and peripheral transistors simultaneously, as mentioned above. Specifically, the present invention falls within a class of processes in which the polysilicon layer making up the gate of the peripheral transistors corresponds to the formation process step in which the control gate polysilicon layer of the memory cells is formed. In these processes the intermediate dielectric of the memory cells and the gate dielectric of the transistors of the circuitry are also formed simultaneously.

A known process, in which it is necessary to form two types of peripheral transistors with differentiated gate oxide thickness, comprises essentially the following steps:

formation of a first polysilicon layer of the floating gate and of the intermediate dielectric, after formation of a gate silicon oxide layer of the cells;

removal of the above mentioned layers from the zones in which the transistors of the circuitry are formed;

formation, by means of high-temperature substrate oxidation, of a silicon oxide layer in the areas in which the peripheral transistors are to be formed;

removal of the silicon oxide layer from the areas of the second transistor type;

formation, again by substrate oxidation, of another silicon oxide layer in the areas of both types of transistor; and formation of a second polysilicon layer of the control gate of the cells which also constitutes the gate of the peripheral transistors.

Recently, in the framework of the research for new types of dielectrics using MOS transistors, there was proposed use of a gate dielectric comprising, in addition to a silicon oxide layer achieved by high-temperature thermal oxidation, an overlying layer also of silicon oxide but achieved by deposition. The benefits of such a composite dielectric are described for example in an article entitled "Thin CVD stacked gate dielectric for ULSI technology" by Hsing-Huang Tseng et al, IEDM Technical Digest, page 321–324, 1993.

In patent U.S. Pat. No. 5,104,819 mentioned above there is disclosed formation of a memory cell matrix having ONO type interpoly dielectric and peripheral transistors with gate dielectric including another deposited silicon oxide layer. The deposited silicon oxide layer of the intermediate dielectric multilayer of the cells also constitutes the gate dielectric upper layer of the peripheral transistors and is formed successively over a first gate thermal silicon oxide layer.

This manufacturing process however only permits formation of a single type of peripheral transistor. In addition the silicon oxide deposited to complete the gate dielectric is not good quality if its deposition is not followed by a so-called thermodynamic annealing process, as indicated to be necessary in the above mentioned article.

The object the present invention is to conceive a process for the formation of non-volatile memory cells and peripheral transistors permitting achievement of a gate dielectric and an intermediate dielectric of good quality, in order to achieve an integrated circuit having characteristics of great reliability and functionality.

Another object is to provide this circuit while minimizing the number of process steps and thus the production costs.

Another object is to provide a process which is particularly flexible and usable, for example, in the simultaneous formation of peripheral transistors having different gate dielectrics.

SUMMARY OF THE INVENTION

In accordance with the present invention a process for the formation of an integrated circuit in a monocrystalline silicon substrate calls for the provision of at least one matrix of non-volatile memory cells in each of which a floating gate and a control gate, both electroconductive, are electrically insulated from each other by means of an intermediate dielectric multilayer comprising a lower silicon oxide layer, an intermediate silicon nitride layer and an upper silicon oxide layer. The process also comprises simultaneous realization in peripheral zones of the matrix of at least first and second transistor types each having a gate dielectric of a first and second thickness, respectively. There is considered in particular a process of the type in which the gate dielectrics of the transistors are formed simultaneously with the intermediate dielectric multilayer of the memory cells.

In accordance with the present invention, after formation of the floating gate with a gate oxide layer and a polycrystalline silicon layer as well as formation of the lower silicon oxide layer and of the intermediate silicon nitride layer, formation of the intermediate dielectric multilayer and of the gate dielectric calls for the following process steps:

removal from the zones peripheral to the matrix of the above mentioned layers;

formation of a first silicon oxide layer over the substrate in the areas of both types of transistors;

removal of the first silicon oxide layer from the areas assigned only to the transistors of the second type;

deposition of said upper silicon oxide layer over the memory cells, over the first silicon oxide layer in the areas of the transistors of the first type and over the substrate in the areas of the transistors of the second type; and formation of a second silicon oxide layer in the areas of both types of peripheral transistors.

In accordance with one embodiment of the invention, formation of the first and second silicon oxide layers takes place by means of a high-temperature treatment in an oxidizing ambient. The gate dielectric layer of all the peripheral transistors is therefore composed of an underlying silicon oxide layer formed by means of thermal treatment, having differentiated thickness, and an overlying silicon oxide layer deposited and densified by the above mentioned thermal treatment.

The gate dielectrics formed can be advantageously nitridized at the end of their formation if desired.

The present invention solves the problems of the prior art by utilizing a process for the formation of an integrated circuit comprising non-volatile memory cells and peripheral transistors of the type described above and defined in the accompanying claims.

The present invention also solves the problems of the prior art by an integrated circuit comprising non-volatile memory cells and peripheral MOS transistors of at least a first and a second types.

The advantages of the formation process in accordance with the present invention are set forth in the Detailed Description of an embodiment thereof given below by way of non-limiting example with reference to the annexed drawings.

BRIEF DESCRIPTION OF THE DRAWINGS

The invention will be better understood and appreciated from the following detailed description of illustrated embodiments thereof, and the accompanying drawings, in which.

DETAILED DESCRIPTION

Figure 1A:
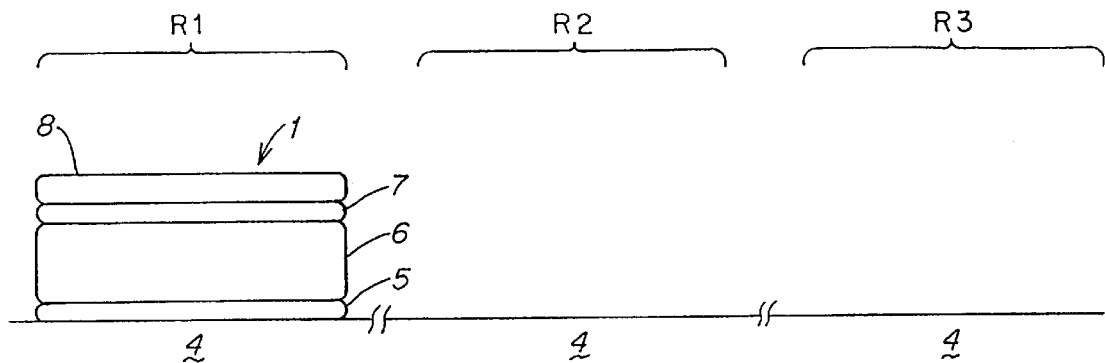
FIGS. 1a–1e show diagrammatic cross section views of successive steps of a process for the formation of non-volatile memory cells and peripheral transistors of a first and a second type in accordance with the present invention.

The description of a formation process for memory cells and peripheral transistors in accordance with the present invention is given below with reference to one preferred embodiment of the present invention as shown in FIGS. 1a–1e. These figures show unscaled diagrammatic cross section views and illustrate in successive steps a formation process for a non-volatile memory cell and at least first and second peripheral MOS transistors. The partial structures of the cell and the transistors are indicated respectively by reference numbers 1, 2 and 3. The regions R1, R2 and R3 represent the zones in which are formed the cell 1 and the transistors 2 and 3.

The two transistors are distinguished from each other by the gate dielectric thickness, which is greater for the first transistor than for the second. In the memory circuit for example they represent respectively a high-voltage transistor and a low-voltage transistor.

There are shown in detail only the more significant process steps for the present invention, regarding the formation of the intermediate dielectric of the cell and the gate dielectric of the transistors.

The intermediate dielectric of the memory cell in accordance with this embodiment of the present invention consists of a triple layer comprising silicon oxide, silicon nitride and silicon oxide in succession.

The diagrammatic structure of the memory cell 1 is consistent with that of any non-volatile memory cell whether EPROM, EEPROM or FLASH, and consists of a floating gate MOS transistor. The peripheral transistors 2 and 3 are also MOS type in accordance with the present invention. The process to which reference is made in the following description of this embodiment is a MOS type process, preferably performed with CMOS technology.

The initial steps of a process of formation of memory cells and peripheral transistors, not shown in the figures because it is conventional, comprise defining insulation regions on a substrate 4 of semiconductor material, usually monocrystalline silicon, where a thick silicon oxide layer, so-called field oxide, is formed and which delimits active area regions. It is noted that the cross sections shown in the figures are contained entirely in active area regions and therefore the field oxide is not visible.

Successively, both in active area regions in which the memory cells will be formed and in external regions in which the peripheral transistors will be formed, and in particular in regions R1, R2 and R3 of FIGS. 1a–1e, silicon oxide, indicated by 5 in the figures, is grown by means of high-temperature thermal oxidation of the substrate. The layer 5 represents the so-called gate oxide of the memory cells. The gate oxide layer of the cells is thin to allow transfer of the charge between the substrate and the floating gate by means of known physical mechanisms. The mechanism used which depends on the type of non-volatile memory used. The gate oxide layers thickness can, vary between 70 Å and 250 Å, depending on the type of non-volatile memory cells and the programming and associated erasure mechanism.

Over this gate oxide layer 5 of the cells is formed a first layer of electroconductive material, indicated in FIG. 1a by 6 and which will constitute the floating gate of the cell 1. The layer 6 consists commonly of a first polycrystalline silicon layer, known briefly as poly 1, and is usually deposited over the entire silicon chip on which the integrated circuit is formed.

The process continues with formation of the lower part of the intermediate dielectric layer of the memory cells. A silicon oxide layer 7 is formed alternatively by Chemical Vapor Deposition (CVD) or by means of high-temperature oxidation of the polysilicon layer 6. In addition a silicon nitride layer 8 is deposited by the CVD technique.

Some steps allow partial definition of the cell structure of the cell, by means of removal in some zones of one or more layers from among those described above. These steps are specific for each different non-volatile memory type, and are not described here for the sake of simplicity.

In accordance with this embodiment of the present invention, before formation of the upper part of the intermediate dielectric of the cells, the layers 7 and 8 of the intermediate dielectric, the polysilicon layer 6 and the gate oxide layer 5 of the cell 1 are removed in succession from the active peripheral areas, i.e. the regions R2 and R3 in which the peripheral transistors are to be formed. Removal takes place by means of a photolithographic technique of masking and successive chemical etching, at the end of which the mask of photosensitive material, usually a resin, is removed. FIG. 1a shows the structure of the memory cell 1 and the regions R2 and R3 assigned to the transistors 2 and 3 after performing this process step.

Advantageously, removal of the mask used for the preceding etching can be followed by a step of cleaning the surface of the entire chip, preferably by means of acid etching, e.g., in hydrofluoric acid (HF). This step has the purpose of eliminating any possible residues of the mask which, being of organic material, introduces impurities, especially on the exposed surface of the substrate in the peripheral regions R2 and R3. The silicon nitride layer 8 of the intermediate dielectric is not damaged by an etching of the above mentioned type.

Figure 1B:
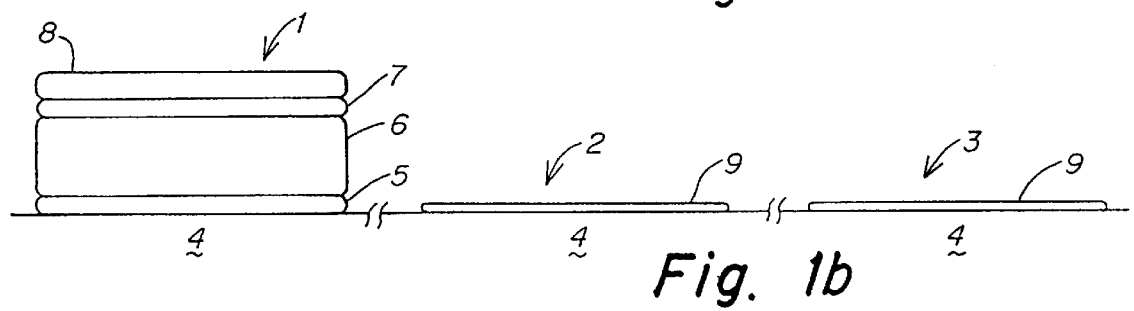

A silicon oxide layer, indicated in FIG. 1b by 9, is formed in this step of the process at least in the areas R2 and R3 of the peripheral transistors. Preferably, this formation-step comprises an operation of oxidation in an oxidizing ambient at high-temperature. This layer 9 of silicon oxide is of the so-called thermal type because it is achieved by means of a thermodynamic process of raising the temperature. The substrate is oxidized superficially in the active areas R2 and R3 of the transistors 2 and 3. The oxidation of the exposed surface of the silicon nitride layer 8 of the cell 1 due to this operation is negligible. The thermal oxide layer 9 will constitute part of the gate dielectric of the transistor 2.

The high-temperature oxidation treatment is preferably performed in an oxidizing ambient in an atmosphere containing oxygen ($O_2$) and/or steam ($H_2O$) and at a temperature between 750° C. and 950° C.

Figure 1C:
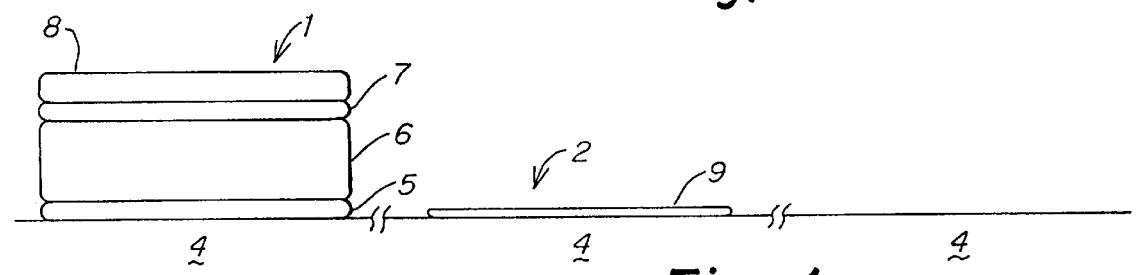

The next step is masking the regions R1 and R2, of the cell 1 and the first transistor 2, to allow removal by means of a photolithographic technique and successive chemical etching of the silicon oxide layer 9 from the region R3 assigned to formation of the second transistor 3. FIG. 1c shows the three regions as they appear after removal of the mask.

In accordance with a preferred embodiment of the present invention the above mentioned removal of the layer 9 takes place if performed in two steps. First the silicon oxide layer 9 is partially removed from the region R3. The mask used is then removed and the etching of the surface of the silicon oxide layer 9 is continued until complete removal of the layer so as to leave exposed the surface of the substrate in the region R3. This second etching step cleans the surface of the nitride layer 8 in the region R1 and the oxide layer 9 in the region R2 of the first transistor 2 of the possible contamination caused by the etching mask applied previously.

Figure 1D:
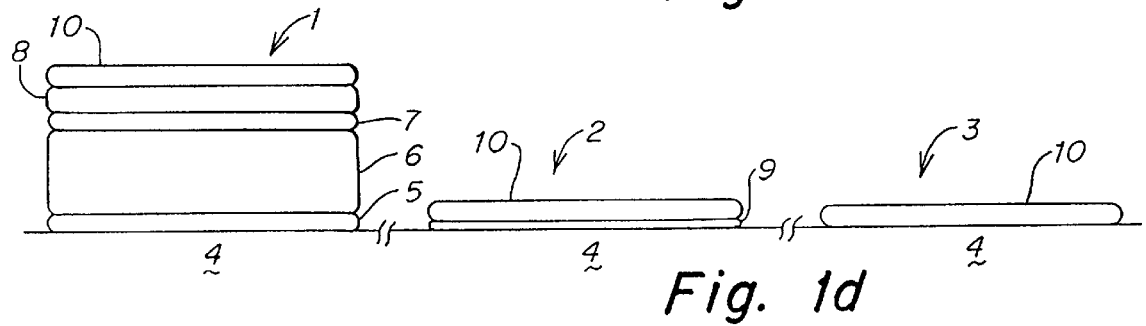
Figure 1E:
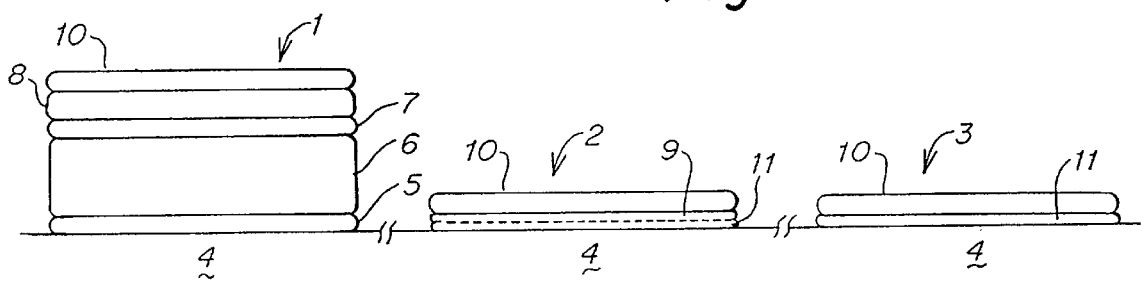

The intermediate dielectric of the cells is completed in the next process step with formation by deposition of a silicon oxide layer 10, as shown in FIG. 1d. Deposition can take place by means of any of the chemical vapor deposition techniques and preferably by means of a High Temperature Oxidation (HTO) technique, i.e., any of the high-temperature CVD techniques. As a chemical source there can be chosen one of the conventional ones, e.g., tetraethylorthosilicate, known to those skilled in the art as TEOS. The thickness of this deposited silicon oxide layer 10 is preferably between 50 Å and 250 Å. Its value depends on that of the underlying intermediate dielectric layers of the cell 1.

As shown in FIG. 1d the layer 10 is deposited not only in the region R1 of the matrix but also in the peripheral regions R2 and R3 where it will constitute the upper part of the gate dielectric of the first and second peripheral transistors 2 and 3.

In the next step to complete the gate dielectrics of the peripheral transistors, an additional silicon oxide layer is formed in the active areas both of the first transistor 2 and of the second transistor 3. The formation is performed in particular by means of an oxidation operation with a high-temperature treatment in oxidizing ambient to induce oxidation of the substrate surface. The thermal silicon oxide layer formed in this step is indicated by 11 in FIG. 1e. It represents the lower layer of the gate dielectric, which is in direct contact with the substrate because it is the result of oxidation of the substrate itself. It is noted that the line of demarcation between the layers 11 and 9 of the first transistor 2 is drawn symbolically with a broken line since the two layers after their formation are essentially indistinguishable.

The oxidation operation for formation of the thermal silicon oxide layer 11 advantageously permits the simultaneous densification of the overlying deposited silicon oxide layer 10.

Preferably, growth of the additional silicon oxide layer 11 takes place by using parameters similar to those chosen above for formation of the silicon oxide layer 9. Therefore, this step is performed preferably in an oxidizing ambient at a temperature between 750° C. and 950° C. and in an atmosphere containing at least one of the following gasses: oxygen ($O_2$) and steam ($H_2O$).

The thickness values of the gate dielectrics of the first and second transistors, preset on the basis of the specific-desired application, are achieved in this step.

Formation of the intermediate dielectric multilayer of the cell 1 and the gate dielectric of the peripheral transistors 2 and 3 in accordance with one embodiment of the present invention is completed by a nitridizing process performed by means of annealing in an ambient containing $N_2O$, to further increase the quality and reliability of the gate dielectrics.

The gate dielectric of both the peripheral transistors 2 and 3 therefore comprises, in the preferred embodiment of the present invention, a double layer. Specifically a thermal silicon oxide layer, 11 and 9 or 11 respectively for the first and second transistors, is in direct contact with the substrate and a deposited silicon oxide layer is overlying. The latter appears in both the transistors as an extension of the upper silicon oxide layer of the intermediate dielectric multilayer of the cell 1.

In accordance with one embodiment of the present invention the overall thicknesses of the gate oxides of both types of transistor are indicatively between 70 Å and 350 Å. The thermal oxide thicknesses also fall within this range.

After the above described formation of the intermediate dielectric multilayer of the cell and the gate dielectric of the peripheral transistors, completion of the cell and the transistors takes place through standard process steps. In particular a second polysilicon layer, or poly 2, and if desired a silicide layer are deposited and then patterned for the simultaneous formation of the control gate of the cell and of the gate of the transistors. The process is completed by appropriate implantations, formation of a passivation layer and of the interconnections by means of opening of contacts, and deposition of one or more metallization layers.

Therefore in the process in accordance with one embodiment of the present invention the gate dielectric of the transistors is not formed after the formation of the intermediate dielectric of the cells. Deposition of the last silicon oxide layer of the intermediate dielectric allows simultaneously achieving the gate dielectric upper layer of the peripheral transistors. Advantageously, in accordance with one embodiment of the present invention, in the transistors 2 and 3 the final thermal oxide layer 11 is formed after the overlying deposited oxide layer 10. This permits formation of the thermal oxide layer and simultaneous densification, as mentioned above, of the layer 10 without further steps such as thermodynamic annealing processes which are essential in the prior art for curing the deposited layer and to ensure operation of the device.

The proposed solution, in which the deposited silicon oxide layer 10 is then densified during at least one successive oxidation step, thus provides gate dielectrics with better quality both in terms of defects and in terms of electrical qualities.

The use of a double layer for formation of gate dielectrics whose upper part is deposited prevents formation of defects in the gate dielectric if considered as a whole. Indeed, a defect in one of the layers is covered by the other and the simultaneous presence of two defects at exactly the same point in the layer is highly improbable.

Furthermore the upper layer being deposited conforms to the underlying structures, allowing covering of irregular growths of oxides in critical positions, e.g., of the field oxide layer at its edges.

It should be remembered that the thermal oxide and the oxide deposited in accordance with the disclosed embodiment of the present invention are distinguishable by means of electrical, physical and optical measurements because they have different dielectric constants.

It is noted that the process in accordance with the disclosed embodiment of the present invention has the advantage of allowing formation of distinct layers of silicon oxide whose thicknesses can be chosen independently. The only fixed value for formation of the layers making up the gate dielectric of the transistors is that of the deposited oxide layer 10, whose thickness should be determined, as known to those skilled in the art and as mentioned above, on the basis of the relative thickness of the other two layers contained in the intermediate dielectric of cell 1 to ensure good operation thereof.

The process in accordance with the disclosed embodiment of the present invention is particularly simple and does not present manufacturing difficulties.

Another advantage of the described process is the flexibility in particular in the use of optional cleaning steps, described above in the explanation of the individual process steps, for optimization of the functionality of the dielectrics.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for forming an integrated circuit in a monocrystalline silicon substrate having implemented thereon a matrix of non-volatile memory cells each having a floating gate and a control gate, each floating gate and control gate being electroconductive and insulated electrically from each other by means of an intermediate dielectric multilayer having a lower silicon oxide layer, an intermediate silicon nitride layer, and an upper silicon oxide layer and the substrate also having simultaneous implementation, in peripheral zones of the memory cells, at least first and second transistors having a gate dielectric of a first and second thickness respectively, the process comprising the steps of:

(A) forming a gate oxide layer, a polycrystalline silicon layer, the lower silicon oxide layer, and the intermediate silicon nitride layer;

(B) removal of the lower silicon oxide layer, the intermediate silicon nitride layer, the polycrystalline silicon layer, and the gate oxide layer from the peripheral zones;

(C) formation of a first silicon oxide layer over the substrate in the areas of the first and the second transistors;

(D) removal of the first silicon oxide layer from the areas of the substrate including only the second transistor;

(E) after step (D), simultaneous deposition of a silicon oxide layer over the memory cells and the peripheral zones in which the at least first and second transistors are formed, the silicon oxide layer forming the upper silicon oxide layer of the intermediate dielectric multilayer of the memory cells, and at least part of the gate dielectrics of the first and second transistors, the silicon oxide layer being deposited over the first silicon oxide layer in the areas including the first transistor, and over the substrate in the areas including the second transistor; and (F) formation of a second silicon oxide layer in the areas of the substrate including the transistors of both the first and the second transistors.

2. The process of claim 1, wherein step (F) includes forming the second silicon oxide layer with oxidation by a treatment of the substrate in an oxidizing ambient.

3. The process of claim 2, wherein the oxidizing ambient is at a temperature between 750° C. and 950° C. in an atmosphere containing at least one of the following compounds from the group consisting of $O_2$ and $H_2O$.

4. The process of claim 1, wherein step (C) includes forming the first silicon oxide layer with oxidation of the substrate.

5. The process of claim 4, wherein the step of oxidation is performed at a temperature between 750° C. and 950° C. in an atmosphere containing at least one of the following compounds from the group consisting of $O_2$ and $H_2O$.

6. The process of claim 1, further comprising a step of nitridizing of the second silicon oxide layer.

7. The process of claim 1, wherein step (D) includes a first step of partial removal of the first silicon oxide layer from the areas of the substrate including only the second transistor, and a second step of removal from portions of the substrate not subjected to the first removal step, the second step performed until the first silicon oxide layer is completely removed from the areas of the substrate including only the second transistor.

8. The process of claim 1, wherein the at least first and second transistors are CMOS transistors.

9. The process of claim 1, wherein the thickness of said upper deposited silicon oxide layer is between 50 Å and 250 Å and said first and said second thicknesses of the gate dielectric are between 70 Å and 350 Å, respectively.

10. A method of fabricating an integrated circuit formed on a substrate, the integrated circuit including a memory cell and first and second transistors, the memory cell including a floating gate, a control gate, and a multilayer dielectric for insulating the floating gate from the control gate, and the first and second transistors including first and second multilayer gate dielectrics having first and second thicknesses, respectively, the method comprising the steps of:

(A) removal of layers forming the memory cell from an area of the substrate in which the first and second transistors are to be formed, the area being peripheral to an area of the substrate in which the memory cell is formed;

(B) forming a first dielectric layer in the area of the substrate in which the first and second transistors are formed;

(C) removing the first dielectric layer from an area of the substrate in which only the first transistor is formed;

(D) after step (C), simultaneously forming a second dielectric over the memory cell and the areas of the substrate in which the first and second transistors are formed, the second dielectric forming part of the multilayer dielectric of the memory cell, and part of the first and second multilayer gate dielectrics of the first and second transistors, respectively; and (E) forming a third dielectric layer in the area of the substrate in which the first and second transistors are formed, such that the second thickness is greater than the first thickness.

11. The method of claim 10, wherein step (A) includes the steps of photolithographic masking of the substrate and chemical etching of the layers forming the memory cell.

12. The method of claim 11, wherein step (B) includes oxidation of the substrate.

13. The method of claim 12, wherein step (C) includes photolithographic masking of the substrate and chemical etching of the the first dielectric layer.

14. The method of claim 13, wherein step (D) includes depositing silicon oxide over the memory cell and the areas of the substrate in which the first and second transistors are formed.

15. The method of claim wherein step (E) includes oxidation of the substrate.

16. The method of claim 1, wherein the at least first and second transistors include a plurality of first transistors having the gate dielectric of the first thickness, and a plurality of second transistors having the gate dielectric of the second thickness.

17. The method of claim 10, wherein step (D) includes depositing a layer of silicon oxide.

* * * * *

UNITED STATES PATENT AND TRADEMARK OFFICE
CERTIFICATE OF CORRECTION

PATENT NO. : 5,856,221
DATED : January 5, 1999
INVENTOR(S) : Cesare Clementi, Gabriella Ghindini and Carlo Riva It is certified that error appears in the above-identified patent and that said Letters Patent is hereby corrected as shown below:

On the title page,

Items [73] and [57] should read as shown below:

[73] SGS-Thomson Microelectronics S.r.l., Agrate Brianza.

[57] Wolf, Greenfield & Sacks, P.C.

Signed and Sealed this

Twentieth Day of July, 1999

*Attest:*

Q. TODD DICKINSON

*Attesting Officer*     *Acting Commissioner of Patents and Trademarks*